(12) United States Patent
Lim

(10) Patent No.: US 10,739,628 B2
(45) Date of Patent: Aug. 11, 2020

(54) STRENGTHENED GLASS PANEL FOR PROTECTING THE SURFACE OF A DISPLAY DEVICE, AND METHOD FOR MANUFACTURING SAME

(71) Applicant: Namil Lim, Seoul (KR)

(72) Inventor: Namil Lim, Seoul (KR)

( * ) Notice: Subject to any disclaimer, the term of this patent is extended or adjusted under 35 U.S.C. 154(b) by 0 days.

(21) Appl. No.: 15/632,275

(22) Filed: Jun. 23, 2017

(65) Prior Publication Data
US 2017/0293179 A1    Oct. 12, 2017

Related U.S. Application Data

(62) Division of application No. 14/342,759, filed as application No. PCT/KR2012/007078 on Sep. 4, 2012, now abandoned.

(30) Foreign Application Priority Data

Sep. 6, 2011 (KR) .................. 10-2011-0090099

(51) Int. Cl.
*G02F 1/1333* (2006.01)
*B32B 7/06* (2019.01)
(Continued)

(52) U.S. Cl.
CPC .......... *G02F 1/133308* (2013.01); *B32B 7/06* (2013.01); *B32B 17/10* (2013.01);
(Continued)

(58) Field of Classification Search
CPC ... G02F 1/133308; G02F 2001/133331; B32B 17/10137; B32B 2457/20; B32B 37/025;
(Continued)

(56) References Cited

U.S. PATENT DOCUMENTS 3,864,204 A    2/1975  Shorr et al.
6,461,709 B1 * 10/2002  Janssen ............ B32B 17/10009
                                                                428/41.7
(Continued)

FOREIGN PATENT DOCUMENTS

EP       2169450 A1      3/2010
KR     20-0422857 Y1     8/2006
(Continued)

OTHER PUBLICATIONS

English translation of Written Opinion of PCT/KR2012/007078.*
(Continued)

*Primary Examiner* — Sonya M Sengupta
(74) *Attorney, Agent, or Firm* — Rabin & Berdo, P.C.

(57) ABSTRACT

Provided are a strengthened glass panel for protecting a surface of a display device and a method for manufacturing the same. Here, the strengthened glass panel includes a strengthened glass layer, a laminate layer uniformly formed on the bottom surface of the strengthened glass layer, and a separation layer configured to cover the laminate layer, wherein the laminate layer is formed by transferring a transfer film. Accordingly, the strengthened glass panel for protecting a surface of a display device can have improved characteristics of neatly attaching the laminate layer to the surface of the display device without lifting or occurrence of air bubbles and easily detaching the laminate layer when a uniform laminate layer is formed on strengthened glass by means of a transfer film.

4 Claims, 4 Drawing Sheets

(51) Int. Cl.
*B32B 17/10* (2006.01)
*B32B 37/00* (2006.01)
*B32B 38/00* (2006.01)
*H05K 5/03* (2006.01)
*G06F 3/03* (2006.01)
*H04M 1/18* (2006.01)
*G06F 1/16* (2006.01)
*B29L 31/34* (2006.01)
*H04M 1/02* (2006.01)

(52) U.S. Cl.
CPC .. *B32B 17/10018* (2013.01); *B32B 17/10137* (2013.01); *B32B 17/10266* (2013.01); *B32B 17/10798* (2013.01); *B32B 37/025* (2013.01); *B32B 38/0004* (2013.01); *B32B 38/145* (2013.01); *G02F 1/1333* (2013.01); *H05K 5/03* (2013.01); *B29L 2031/3475* (2013.01); *B32B 2367/00* (2013.01); *B32B 2457/20* (2013.01); *G02F 2001/133331* (2013.01); *G02F 2201/50* (2013.01); *G06F 1/1626* (2013.01); *G06F 3/0304* (2013.01); *G06F 2200/1634* (2013.01); *H04M 1/0266* (2013.01); *H04M 1/185* (2013.01); *Y10T 156/1062* (2015.01)

(58) Field of Classification Search
CPC .............. B32B 38/0004; B32B 38/145; B32B 2307/412; B32B 27/08; B32B 27/32; B32B 27/36; B32B 3/10; B32B 3/26; B32B 7/05; B32B 7/12; G06F 3/013; G06F 3/0304; G06F 1/1626; G06F 2200/1634; H04M 1/185; H04M 1/0266; B29L 2031/3475; Y10T 428/1471
USPC .................................................. 156/239, 247
See application file for complete search history.

(56) References Cited

U.S. PATENT DOCUMENTS

| | | | | |
|---|---|---|---|---|
| 6,482,488 B1 * | 11/2002 | Janssen | ...................... | E06B 5/10 428/40.1 |
| 6,582,789 B1 * | 6/2003 | Sumi | ........................ | C09J 7/255 428/40.1 |
| 2003/0085649 A1 | 5/2003 | Wachi et al. | | |
| 2004/0065403 A1 * | 4/2004 | Hattori | .................... | B32B 38/10 156/230 |
| 2005/0077826 A1 * | 4/2005 | Watanabe | ............... | B32B 27/36 313/587 |
| 2006/0152648 A1 * | 7/2006 | Kim | .................. | G02F 1/133308 349/58 |
| 2006/0279679 A1 * | 12/2006 | Fujisawa | ........... | G02F 1/133305 349/116 |
| 2007/0042177 A1 * | 2/2007 | Setsuda | .................... | C03C 17/34 428/332 |
| 2007/0065091 A1 * | 3/2007 | Hinata | .............. | G02F 1/133308 385/147 |
| 2009/0202808 A1 | 8/2009 | Glaesemann et al. | | |
| 2010/0178496 A1 | 7/2010 | Masuda et al. | | |
| 2011/0003619 A1 | 1/2011 | Fujii | | |
| 2011/0250460 A1 | 10/2011 | Banba et al. | | |
| 2011/0279383 A1 * | 11/2011 | Wilson | ...................... | B32B 7/12 345/173 |
| 2013/0316133 A1 * | 11/2013 | Kim | .......................... | B32B 3/02 428/137 |

FOREIGN PATENT DOCUMENTS

| | | | |
|---|---|---|---|
| KR | 10-2008-0039574 A | | 5/2008 |
| KR | 20080039574 A | * | 5/2008 |
| KR | 10-2009-0114957 A | | 11/2009 |
| KR | 20090114957 A | * | 11/2009 |
| KR | 10-2011-0067436 A | | 6/2011 |
| WO | 2007/089054 A1 | | 8/2007 |
| WO | WO2009008402 A1 | * | 1/2009 |
| WO | 2009/063847 A1 | | 5/2009 |
| WO | 2010/044467 A | | 2/2010 |

OTHER PUBLICATIONS

English translation of KR2008039574.*
English translation of KR2009114957.*
English translation of KR2011067436.*
English translation of WO2009008402.*

* cited by examiner

【Figure 1】
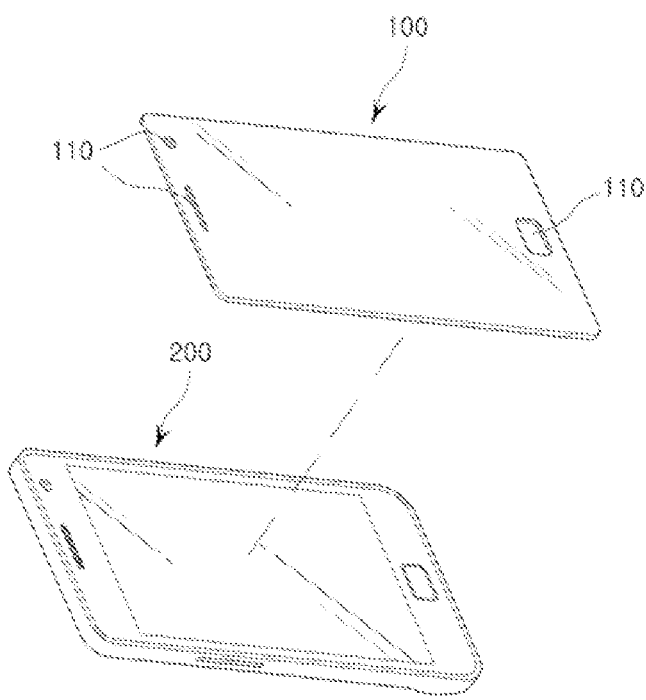
【Figure 2】
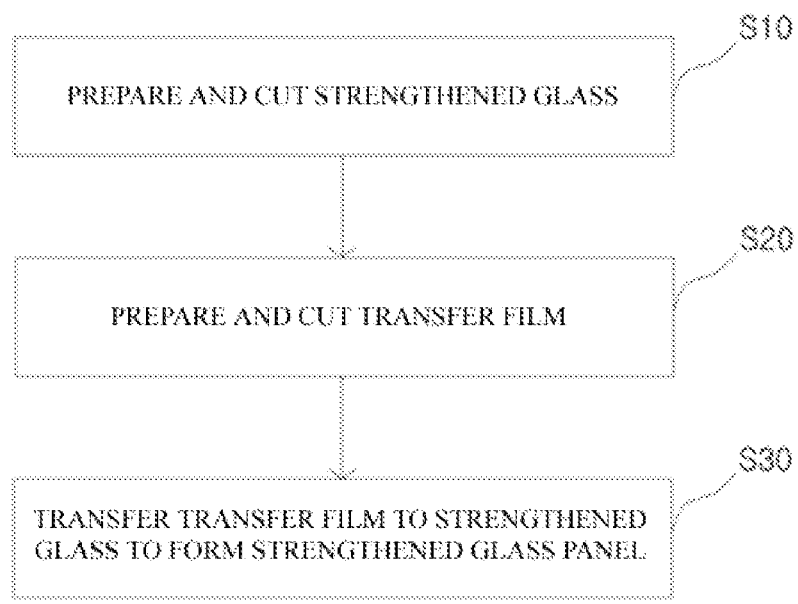

【Figure 3】
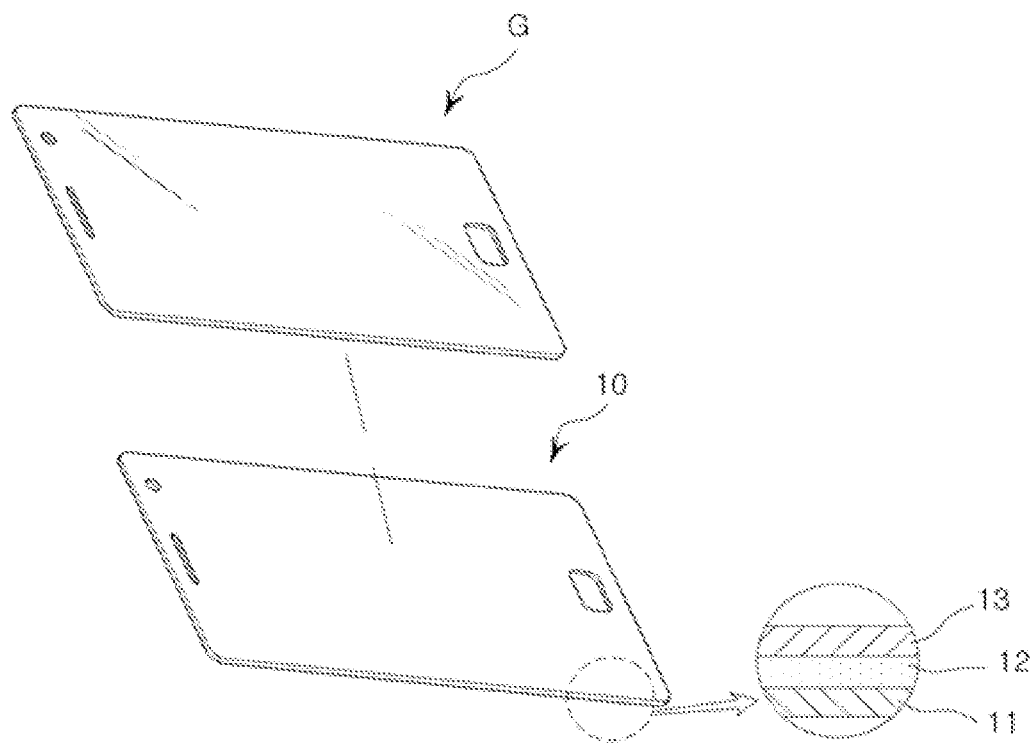
【Figure 4】
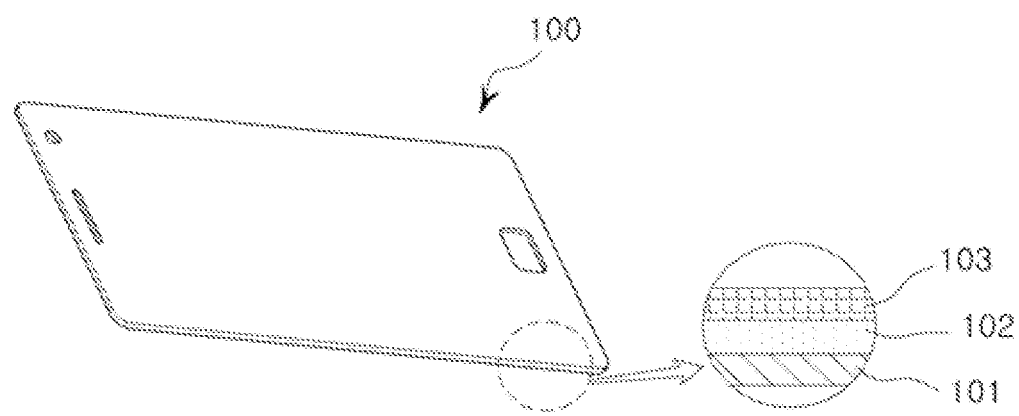

【Figure 5】
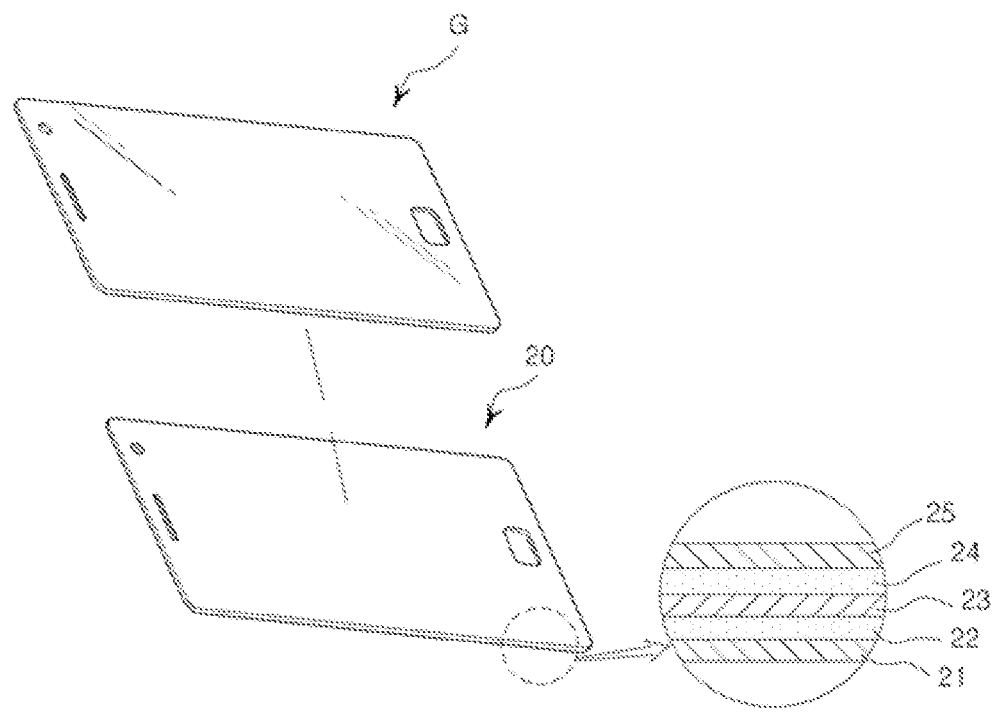
【Figure 6】
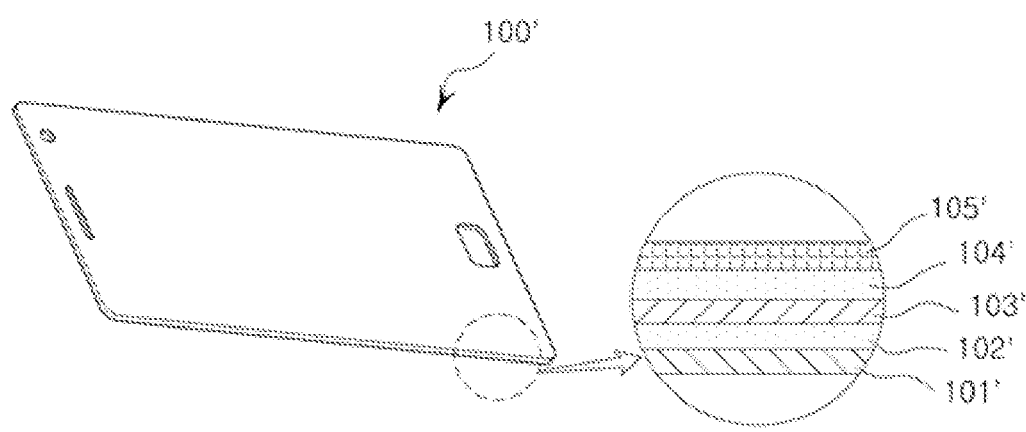

【Figure 7】
(a)
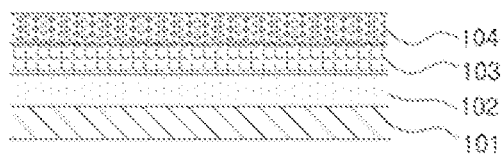
(b)
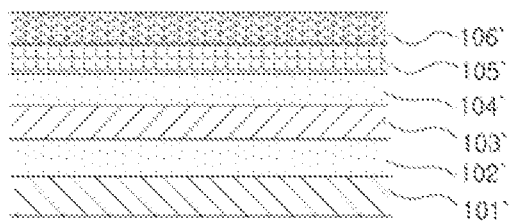
【Figure 8】
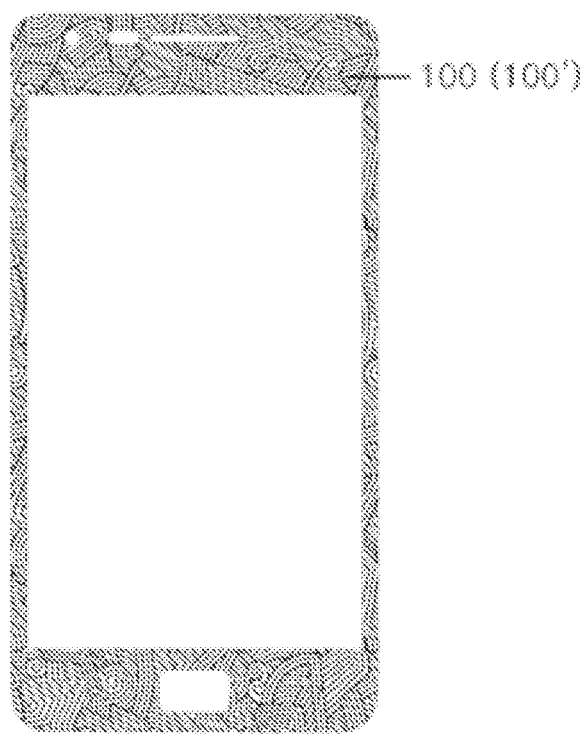

STRENGTHENED GLASS PANEL FOR PROTECTING THE SURFACE OF A DISPLAY DEVICE, AND METHOD FOR MANUFACTURING SAME

CROSS-REFERENCE TO RELATED APPLICATIONS

The present application is a divisional of U.S. application Ser. No. 14/342,759 filed on Mar. 4, 2014, which is a national-stage application under 35 USC § 371 of PCT/KR2012/007078 filed on Sep. 4, 2012, and claims the priority to Korean patent application No. 10-2011-0090099 filed on Sep. 6, 2011, the entire contents of which are hereby incorporated by reference.

TECHNICAL FIELD

The present invention relates to a strengthened glass panel for protecting a surface of a display device and a method for manufacturing the same, and, more particularly, to a strengthened glass panel for protecting a surface of a display device, which has improved characteristics of neatly attaching the laminate layer to the surface of the display device without lifting or occurrence of air bubbles and easily detaching the laminate layer when a uniform laminate layer is formed on strengthened glass by means of a transfer film, and a method for manufacturing the same.

BACKGROUND ART

In recent years, various cell phones including smart phones, smart pads and the like, and various display devices such as MP3 players, PDAs, navigation systems and the like have been increasingly used with the sudden advent of information age. However, since most of these display devices are expensive electronic products, users feel the necessity of protecting these display devices from scratches or external impacts and decorating the display devices in order to make the appearances of the display devices better.

In particular, since liquid crystals disposed on the entire surface of the display device are exposed to strong external impacts in a defenseless state, the liquid crystals may be easily broken, and the broken liquid crystals should be replaced with new liquid crystals, or the display device itself should be optionally replaced with new one, which leads to an enormous increase in repair cost.

Therefore, strengthened glass panels are being currently launched to facilitate protection of the liquid crystals disposed on a surface of the display device. For example, conventional liquid crystal protection films respond to weak impact such as scratches, but strengthened glass protection panels serve to prevent damage of expensive liquid crystals by protecting the liquid crystals from strong external impacts. As a result, the strengthened glass protection panels have received an enthusiastic attention from consumers.

That is, the strengthened glass panel is formed with strengthened glass to reinforce the surfaces of liquid crystals so that the strengthened glass is attached to a surface of a display device to prevent the liquid crystals from being broken or scratched when the display device such as a smart phone is dropped from a high place.

However, strengthened glass panels that are being currently launched are inferior in quality since a double-coated adhesive tape is attached to the rear surface of strengthened glass, and thus have problems in that air bubbles may be easily generated when such a strengthened glass panel is attached to a surface of the display device, the double-coated adhesive tape is not easily detached due to its adhesivity when it is once attached to the display device, and residual adhesive components are left on the surface of the display device even when it is detached from the display device, thereby giving an unpleasant feeling about the appearance of the display device.

Therefore, Registered Utility Model No. 20-0452552 discloses a liquid crystal protection plate in which a double-coated adhesive tape is coated on portions of edges of strengthened glass without applying the double-coated adhesive tape to the entire rear surface of the strengthened glass. However, the liquid crystal protection plate has a problem in that a central region of the liquid crystal protection plate may be convexly lifted since the central region of the liquid crystal protection plate is not closely adhered to surfaces of the liquid crystals in the display device.

Accordingly, there is a demand for a strengthened glass panel which can be closely attached to a surface of the display device and easily detached from the surface of the display device.

DISCLOSURE

Technical Problem

The present invention is directed to a strengthened glass panel for protecting a surface of a display device, which has improved characteristics of neatly attaching the laminate layer to the surface of the display device without lifting or occurrence of air bubbles and easily detaching the laminate layer when a uniform laminate layer is formed on strengthened glass by means of a transfer film, and a method for manufacturing the same.

Technical Solution

According to an aspect of the present invention, there is provided a strengthened glass panel for protecting a surface of a display device. Here, the strengthened glass panel includes a strengthened glass layer, a laminate layer uniformly formed on the bottom surface of the strengthened glass layer, and a separation layer configured to cover the laminate layer. In this case, the laminate layer is formed by transferring a transfer film, the transfer film includes a first film resin layer, a film laminate layer disposed on the first film resin layer, and a second film resin layer disposed on the film laminate layer, the strengthened glass panel is formed by removing the second film resin layer of the transfer film and transferring the film laminate layer and the first film resin layer to the strengthened glass layer, and the strengthened glass panel is attached to the surface of the display device by means of the first laminate layer after separation of the separation layer in order to protect the surface of the display device.

In this case, a printed layer may be formed on the top surface of the strengthened glass layer.

According to another aspect of the present invention, there is provided a strengthened glass panel for protecting a surface of a display device. Here, strengthened glass panel includes a separation layer, a first laminate layer formed on the separation layer, a resin layer formed on the first laminate layer, a second laminate layer formed on the resin layer, and a strengthened glass layer disposed on the second laminate layer. In this case, the laminate layer are formed by transferring a transfer film, the transfer film includes a first film resin layer, a first film laminate layer disposed on the first film resin layer, a second film resin layer disposed on the first film laminate layer, a second film laminate layer disposed on the second film resin layer, and a third film resin layer disposed on the second film laminate layer, the strengthened glass panel is formed by removing the third film resin layer of the transfer film and transferring the second film laminate layer, the second film resin layer, the first film laminate layer and the first film resin layer to the strengthened glass layer, and the strengthened glass panel is attached to the surface of the display device by means of the laminate layer after separation of the separation layer in order to protect the surface of the display device.

In this case, a printed layer may be formed on the top surface of the strengthened glass layer.

According to still another aspect of the present invention, there is provided a method for manufacturing a strengthened glass panel for protecting a surface of a display device. Here, the method includes preparing strengthened glass and cutting the strengthened glass so that the shape of the strengthened glass corresponds to the shape of the display device to which the strengthened glass is to be attached, preparing a transfer film to be transferred to the cut strengthened glass and cutting the transfer film so that the transfer film has the same shape as the cut strengthened glass, and transferring the transfer film to the strengthened glass to form a strengthened glass panel. In this case, the strengthened glass panel includes a strengthened glass layer, a laminate layer uniformly formed on the bottom surface of the strengthened glass layer, and a separation layer configured to cover the laminate layer, the laminate layer is formed by transferring the transfer film, the transfer film includes first film resin layer, a film laminate layer disposed on the first film resin layer, and a second film resin layer disposed on the film laminate layer, the strengthened glass panel is formed by removing the second film resin layer of the transfer film and transferring the film laminate layer and the first film resin layer to the strengthened glass layer, and the strengthened glass panel is attached to the surface of the display device by means of the laminate layer after separation of the separation layer in order to protect the surface of the display device.

According to yet another aspect of the present invention, there is provided a method for manufacturing a strengthened glass panel for protecting a surface of a display device. Here, the method includes preparing strengthened glass and cutting the strengthened glass so that the shape of the strengthened glass corresponds to the shape of the display device to which the strengthened glass is to be attached, preparing a transfer film to be transferred to the cut strengthened glass and cutting the transfer film so that the transfer film has the same shape as the cut strengthened glass, and transferring the transfer film to the strengthened glass to form a strengthened glass panel. In this case, the strengthened glass panel includes a separation layer, a first laminate layer formed on the separation layer, a first laminate layer formed on the separation layer, a resin layer formed on the first laminate layer, a second laminate layer formed on the resin layer, and a strengthened glass layer disposed on the second laminate layer, the laminate layer is formed by transferring the transfer film, the transfer film includes a first film resin layer, a first film laminate layer disposed on the first film resin layer, a second film resin layer disposed on the first film laminate layer, a second film laminate layer disposed on the second film resin layer, and a third film resin layer disposed on the second film laminate layer, the strengthened glass panel is formed by removing the third film resin layer of the transfer film and transferring the second film laminate layer, the second film resin layer, the first film laminate layer and the first film resin layer to the strengthened glass layer, and the strengthened glass panel is attached to the surface of the display device by means of the first laminate layer after separation of the separation layer in order to protect the surface of the display device.

In this case, a printed layer may be formed on the top surface of the strengthened glass layer.

Advantageous Effects

According to the present invention, there are provided a strengthened glass panel for protecting a surface of a display device can have improved characteristics of neatly attaching the laminate layer to the surface of the display device without lifting or occurrence of air bubbles and easily detaching the laminate layer when a uniform laminate layer is formed on strengthened glass by means of a transfer film, and a method for manufacturing the same.

DESCRIPTION OF DRAWINGS

FIG. 1 is a diagram showing a strengthened glass panel and a display device to which the strengthened glass panel is attached according to the present invention.

FIG. 2 is a flowchart illustrating processes of a method for manufacturing a strengthened glass panel according to the present invention.

FIG. 3 is a diagram showing strengthened glass and a transfer film to be transferred to the strengthened glass. Here, an expanded diagram shows a portion of the transfer film having a layered structure.

FIG. 4 is a diagram showing a strengthened glass panel formed by transferring the transfer film to the strengthened glass as shown in FIG. 3. Here, an expanded diagram shows a portion of the strengthened glass panel having a layered structure.

FIG. 5 is a diagram showing strengthened glass and a transfer film to be transferred to the strengthened glass according to still another exemplary embodiment of the present invention. Here, an expanded diagram shows a portion of the transfer film having a layered structure.

FIG. 6 is a diagram showing a strengthened glass panel formed by transferring the transfer film to the strengthened glass as shown in FIG. 5. Here, an expanded diagram shows a portion of the strengthened glass panel having a layered structure.

FIG. 7 is a diagram showing still another exemplary embodiment of the present invention.

FIG. 8 is a diagram showing a strengthened glass panel in which the printed layer as shown in FIG. 7 is formed on the top surface of the strengthened glass layer.

BEST MODE

Hereinafter, the present invention will be described in further detail with reference to the accompanying drawings.

FIG. 1 is a diagram showing a display device 200 having a strengthened glass panel 100 disposed thereon according to the present invention. The strengthened glass panel 100 is mainly disposed to cover a surface of the display device 200 on which liquid crystals are disposed, and a plurality of through holes 110 are disposed according to the shape of the display device in order to expose function buttons of the display device 200 to be attached to the strengthened glass panel 100.

FIG. 2 is a flowchart illustrating processes of a method for manufacturing a strengthened glass panel according to the present invention. First, strengthened glass is prepared, and cut so that the shape of the strengthened glass can correspond to the shape of a display device 200 to which the strengthened glass is to be attached (S10). A plurality of through holes as shown in FIG. 1 are also formed in advance in the cut strengthened glass. The strengthened glass has a proper thickness of approximately 0.2 to 0.5 mm.

Next, a transfer film to be transferred to the cut strengthened glass is prepared, and cut so that the transfer film can have the same shape as the cut strengthened glass (S20). Like the cut strengthened glass, a plurality of through holes are formed in advance in the cut transfer film in order to expose regions such as function buttons of the display device to be attached to the transfer film.

When the strengthened glass and the transfer film are prepared, the transfer film is transferred to the strengthened glass to form a strengthened glass panel (S30).

Exemplary embodiments of the transfer film to be attached to the cut strengthened glass are shown in FIGS. 3 and 5. According to the exemplary embodiment as shown in FIG. 3, a film laminate layer 12 is formed on a first film resin layer 11, and a second film resin layer 13 is formed on the film laminate layer 12. The first and second film resin layers are preferably formed of PET, and the film laminate layer 12 is preferably formed of a silicone adhesive.

When the transfer film 10 cut to have the same shape as the strengthened glass prepared and cut according to the shape of the display device is transferred to the previously prepared strengthened glass G after detachment of the second film resin layer 13 as shown in FIG. 3, a strengthened glass panel 100 is formed, as shown in FIG. 4. That is, the film laminate layer 12 and the first film resin layer 11 of the transfer film 10 are transferred to the cut strengthened glass.

That is, the strengthened glass panel 100 as shown in FIG. 4 includes a strengthened glass layer 103, a laminate layer 102 and a separation layer 101. Here, the laminate layer 102 and the separation layer 101 have the film laminate layer 12 and the first film resin layer 11 of the transfer film 10 transferred respectively to the bottom surfaces thereof.

Therefore, when a user detaches the separation layer 101 formed on the bottom surface of the strengthened glass panel 100 and attaches the strengthened glass panel 100 to the surface of the display device, the strengthened glass panel 100 is stably attached to the surface of the display device by means of the laminate layer 102 uniformly formed on the bottom surface of the strengthened glass panel 100 without lifting or occurrence of air bubbles, and is also easily detached from the display device.

That is, as the laminate layer 102 is uniformly formed on the entire surface of the strengthened glass panel 100 rather than some surface of the strengthened glass panel 100, the strengthened glass panel 100 may prevent lifting or occurrence of air bubbles as a whole, and may be easily detached since an easily attachable/detachable silicone adhesive is used instead of a strong adhesive such as a double-coated adhesive tape.

Therefore, even when a user detaches the strengthened glass panel 100 attached to a wrong place and re-attaches the strengthened glass panel 100 to a proper place, the strengthened glass panel 100 may be detached from the surface of the display device 200 without leaving a residual substance of the laminate layer behind or causing damage to the surface of the display device 200.

FIG. 5 is a diagram showing another exemplary embodiment of the transfer film. The transfer film 20 as shown in FIG. 5 has a structure in which a first film laminate layer 22 is formed on a first film resin layer 21, a second film resin layer 23 is formed on the first film laminate layer 22, a second film laminate layer 24 is formed on the second film resin layer 23, and a third film resin layer 25 is formed on the second film laminate layer 24. Here, the first to third film resin layers are preferably formed of PET, and the first and second film laminate layers are preferably formed of a silicone adhesive.

The transfer film 20 formed as shown in FIG. 5 is cut according to the shape of the display device to be attached to the transfer film 20, and transferred to the strengthened glass G cut in advance to have the same shape as the display device after removal of the third film resin layer 25. That is, the first film resin layer 21, the first film laminate layer 22, the second film resin layer 23 and the second film laminate layer 24 of the transfer film 20 are directly transferred to the bottom surface of the strengthened glass.

As a result, a strengthened glass panel 100' as shown in FIG. 6 has a structure in which a separation layer 101', a first laminate layer 102', a resin layer 103', a second laminate layer 104' and a strengthened glass layer 105' are stacked sequentially. In this case, it could be seen that the strengthened glass panel 100' further includes the resin layer 103' and the second laminate layer 104', compared to the exemplary embodiment as shown in FIG. 4. In this configuration, the resin layer 103' and the second laminate layer 104' serve to prevent fragments of strengthened glass from being scattered when the strengthened glass layer 105' is damaged by strong external impacts.

Therefore, the strengthened glass panel 100' may have an effect of preventing the fragments of the strengthened glass from being scattered when the strengthened glass layer 105' is damaged.

When a user wants to attach the strengthened glass panel 100' shown in FIG. 6 to a surface of the display device 200, and the strengthened glass panel 100' is attached according to the shape of the display device 200 after removal of the separation layer 101'. Since the first laminate layer 102' is uniformly applied to the entire surface of the strengthened glass panel 100', there are no probabilities of causing occurrence of air bubbles and lifting between the strengthened glass panel 100' and the display device 200. Also, when the strengthened glass panel 100' is attached to a wrong place, the strengthened glass panel 100' may be detached from the display device 200 without leaving a residual substance of the laminate layer behind, thereby facilitating convenience in use of the display device.

FIG. 7 is a diagram showing still another exemplary embodiment of the present invention. In this case, printed layers 104 and 106' may be formed on the strengthened glass panels 100 and 100' as shown in FIGS. 4 and 6. The printed layers may be formed using a method such as silk printing or UV printing, or may be formed in a multi-layered structure using the silk printing and UV printing methods together.

FIG. 7(A) shows that the printed layer 104 is further formed in the strengthened glass panel 100 as shown in FIG. 4. The printed layer is formed on the top surface of the strengthened glass layer 103 formed on the strengthened glass panel 100. The printed layer may be formed using a silk printing or UV printing method, or may be formed using a silk printing method followed by a UV printing method. In this case, the printed layer may be formed on the entire surface or some surface of the strengthened glass layer 103.

FIG. 7(B) shows that the printed layer 106' is further formed in the strengthened glass panel 100' as shown in FIG. 6. The printed layer is formed on the top surface of the strengthened glass layer 105' formed on the strengthened glass panel 100'. Like in FIG. 7(A), the printed layer may be formed using a silk printing or UV printing method, or may be formed using a silk printing method followed by a UV printing method. In this case, the printed layer may be formed on the entire surface or some surface of the strengthened glass layer 105'.

FIG. 8 is a diagram showing a strengthened glass panel in which the printed layer as shown in FIG. 7 is formed on the top surface of the strengthened glass layer. As the printed layer is formed, the strengthened glass panels 100 and 100' may also be effectively used for decorations, and advertising & public relations. When company names or advertising slogans are printed with patterns or designs having various colors, the effects of advertising & public relations may be further improved.

While the invention has been shown and described with reference to certain exemplary embodiments thereof, it will be understood by those skilled in the art that various changes in form and details may be made therein without departing from the scope of the invention as defined by the appended claims.

| 100, 100': strengthened glass panel | 110: through hole |
|---|---|
| 10, 20: transfer film | 200: display device |

The invention claimed is:

1. A method for manufacturing a strengthened glass panel for protecting a surface of a display device, comprising:
    preparing a strengthened glass having a shape corresponding to the surface of the display device to which the strengthened glass is to be attached;
    preparing a transfer film separately from the strengthened glass, the transfer film having the same shape with the strengthened glass, wherein the transfer film comprises
        a first film resin layer made of Polyethylene terephthalate (PET),
        a film laminate layer made of silicone adhesive, and
        a second film resin layer made of Polyethylene terephthalate (PET),
        wherein
            the first film resin layer, the film laminate layer and the second film resin layer are disposed in order, and the first film resin layer and the second film resin layer are detachably attached to the film laminate layer with directly contacting thereto;
    then, detaching the second film resin layer from the film laminate layer while the first film resin layer is maintained to be attached to the film laminate layer, and
    then, attaching the film laminate layer to the strengthened glass such that the film laminate layer directly contacts with the strengthened glass,
    wherein the strengthened glass panel is configured to be attached to the surface of the display device after separating the first film resin layer from the strengthened glass panel.

2. The method of claim 1, wherein a printed layer is formed on a top surface of the strengthened glass, wherein the top surface is opposite to a surface on which the transfer film is attached.

3. A method for manufacturing a strengthened glass panel for protecting a surface of a display device, comprising:
    preparing a strengthened glass having a shape corresponding to the surface of the display device to which the strengthened glass is to be attached;
    preparing a transfer film separately from the strengthened glass, the transfer film having the same shape with the strengthened glass, wherein the transfer film comprises
        a first film resin layer made of Polyethylene terephthalate (PET),
        a first film laminate layer,
        a second film resin layer,
        a second film laminate layer made of silicone adhesive, and
        a third film resin layer made of Polyethylene terephthalate (PET),
        wherein the first film resin layer, the first film laminate layer, the second film resin layer, the second film laminate layer and the third film resin layer are disposed in order, and the first film resin layer and the third film resin layer are detachably attached to the first film laminate layer and the second film laminate layer, respectively, with directly contacting thereto; and
    then, detaching the third film resin layer from the second laminate layer while the first film resin layer, the first film laminate layer, the second film resin layer, the second film laminate layer are maintained to be attached to each other, and
    then, attaching the second laminate layer to the strengthened glass such that the second film laminate layer directly contacts with the strengthened glass,
    wherein the strengthened glass panel is configured to be attached to the surface of the display device after separating the first film resin layer from the strengthened glass panel.

4. The method of claim 3, wherein a printed layer is formed on a top surface of the strengthened glass, wherein the top surface is opposite to a surface on which the transfer film is attached.

* * * * *